(12) United States Patent
Ng et al.

(10) Patent No.: US 8,016,010 B2
(45) Date of Patent: Sep. 13, 2011

(54) ROTARY BONDING TOOL WHICH PROVIDES A LARGE BOND FORCE

(75) Inventors: Yin Fun Ng, Hong Kong (CN); Gary Peter Widdowson, Hong Kong (CN); Hon Chiu Hui, Hong Kong (CN)

(73) Assignee: ASM Assembly Automation Ltd, Hong Kong (CN)

( * ) Notice: Subject to any disclaimer, the term of this patent is extended or adjusted under 35 U.S.C. 154(b) by 198 days.

(21) Appl. No.: 12/552,585

(22) Filed: Sep. 2, 2009

(65) Prior Publication Data

US 2011/0048648 A1     Mar. 3, 2011

(51) Int. Cl.
*B29C 65/80*     (2006.01)
(52) U.S. Cl. ........... 156/538; 228/45; 228/49.2; 464/29; 29/740

(58) Field of Classification Search ............... 156/358, 156/538; 228/45, 47.1, 49.1, 49.2; 464/29; 384/192; 29/740, 759
See application file for complete search history.

(56) References Cited

U.S. PATENT DOCUMENTS 6,651,866 B2 * 11/2003 Bendat et al. .............. 228/45

* cited by examiner

*Primary Examiner* — Khanh Nguyen
*Assistant Examiner* — John Blades
(74) *Attorney, Agent, or Firm* — Ostrolenk Faber LLP

(57) ABSTRACT

A die bonder comprises a bond head having a load shaft which passes through the bond head and a collet located at one end of the load shaft for holding a die to be bonded. A bond force motor is operative to drive the load shaft along a travel axis in directions towards and away from a die bonding position. A rotary motor is operative to rotate the load shaft about a rotational axis parallel to the travel axis. A coupler which comprises a bearing couples the load shaft to the bond force motor to allow the load shaft to rotate about the rotational axis relative to the bond force motor.

14 Claims, 2 Drawing Sheets

ROTARY BONDING TOOL WHICH PROVIDES A LARGE BOND FORCE

FIELD OF THE INVENTION

The invention relates to a die bonder for electronic devices, and in particular, to a rotary bonding tool for generating a large bond force for die bonding.

Background and Prior Art

During the production of semiconductor dice or chips, many semiconductor dice are formed together on a single wafer. The wafer is then cut to separate the individual dice. Each of these semiconductor dice should then be individually mounted onto a support surface of a substrate or other carrier for further processing by utilizing a die bonding process. Thereafter, electrical connections are created between the dice and external devices, and the dice are later encapsulated with a plastic compound to protect them from the environment.

In prior art die bonders utilized in the said die bonding process, each individual die is usually picked up by a bond arm from the wafer and then transported to a substrate to perform attachment of the die onto the substrate. A die bonder generally comprises a die bond head which has an air nozzle for creating a suction force to pick up a semiconductor die from a wafer platform holding the die. The die is then transported and bonded onto the substrate.

In order to place the die correctly and accurately onto the substrate, visual alignment is conducted with a vision system to capture images of the die on the wafer platform and the substrate. Positioning of the bond head and air nozzle will be performed according to the image captured of the die, which references an alignment pattern or a fiducial mark on the die for this purpose. Preferably, the bond head uses the captured image of the die to perform rotary compensation along a theta axis after picking up the die. The bond head rotates and aligns the die to the orientation of the substrate before moving downwards to perform bonding. Downward movement of the bond head is driven by a z-axis motion motor while a bond force actuator applies a compressive force to the die directly. The compressive bonding force from the bond force actuator must be sufficiently large for pressing the die to the substrate.

FIG. 1 is a side view of a conventional die bonder 100 incorporating a pneumatic cylinder to provide a bonding force. A bond head 102 is mounted to a bond force motor in the form of a pneumatic cylinder 104 mounted to a support structure 120 which is coupled to a z-axis motion table 106 via an axial coupler 108. The axial coupler 108 primarily comprises a steel ball 110 located between the pneumatic cylinder 104 and a load shaft 112 which is connected to a collet 114. The steel ball 110 is preloaded by tension springs 111 to form a spherical point of contact between the steel ball 110 and the pneumatic cylinder 104. The axial coupler 108 provides some degree of freedom in the XY direction for correcting any misalignment between the pneumatic cylinder 104 and the load shaft 112 when adjusting the co-planarity of the collet 114 with respect to a bonding stage 116 with the aid of a tilting alignment mechanism 118.

A low bonding force can be applied by generating an upward force from the pneumatic cylinder 104 together with the axial coupler 108 to counterbalance the weight of the load shaft 112 and the collet 114. A large bonding force is applied with the aid of the pneumatic cylinder 104 applying a downward force. The large bonding force is sustained by the support structure 120 directly and the main lines of force bypass a bond head mount 122 and the z-axis motion table 106 as a slider 123 located adjacent to the load shaft 112 decouples the pneumatic cylinder 104 from the bond head mount 122. Thus, deformation of the bond head mount 122 and the z-axis motion table 106 can be avoided. Die tilting due to the bond head mount 122 and deformation of the z-table motion table 106 structure can also be avoided. Placement error due to the roll, pitch and yaw of the z-axis motion table 106 can also be reduced as there is no z-axis drive-in motion by the z-axis motion table 106. However in this design, the bond head 102 is not able to produce theta motion as the load shaft 112 is fixedly coupled to the pneumatic cylinder 104, which is solely a linear driver. The axial coupler 108 couples the pneumatic cylinder 104 axially, but it cannot decouple any theta motion between the pneumatic cylinder 104 relative to the bond head 102. Hence, there can be no rotary or theta compensation before a picked die 124 is bonded to a substrate 126.

It would be desirable to implement a bond head capable of generating a large bonding force with reduced placement error, as well as provide rotary or theta compensation to correct any rotary offset of the die.

Summary Of the Invention

It is thus an object of the invention to seek to provide a bond head that produces a large bond force while achieving more accurate die bonding as compared to the aforesaid prior art through the correction of a rotary offset of a die.

Accordingly, the invention provides a die bonder comprising a bond head having a load shaft passing through the bond head and a collet located at one end of the load shaft for holding a die to be bonded; a bond force motor operative to drive the load shaft along a travel axis in directions towards and away from a die bonding position; a rotary motor operative to rotate the load shaft about a rotational axis parallel to the travel axis; and a coupler for coupling the load shaft to the bond force motor; wherein the coupler further comprises a bearing which is configured to allow the load shaft to rotate about the rotational axis relative to the bond force motor.

It will be convenient to hereinafter describe the invention in greater detail by reference to the accompanying drawings. The particularity of the drawings and the related description is not to be understood as superseding the generality of the broad identification of the invention as defined by the claims.

Brief Description Of the Drawings

The present invention will be readily appreciated by reference to the detailed description of one preferred embodiment of the invention when considered with the accompanying drawings, in which.

Detailed Description Of the Preferred Embodiment Of the Invention

The preferred embodiment of the present invention will be described hereinafter with reference to the accompanying drawing.

Figure 1:
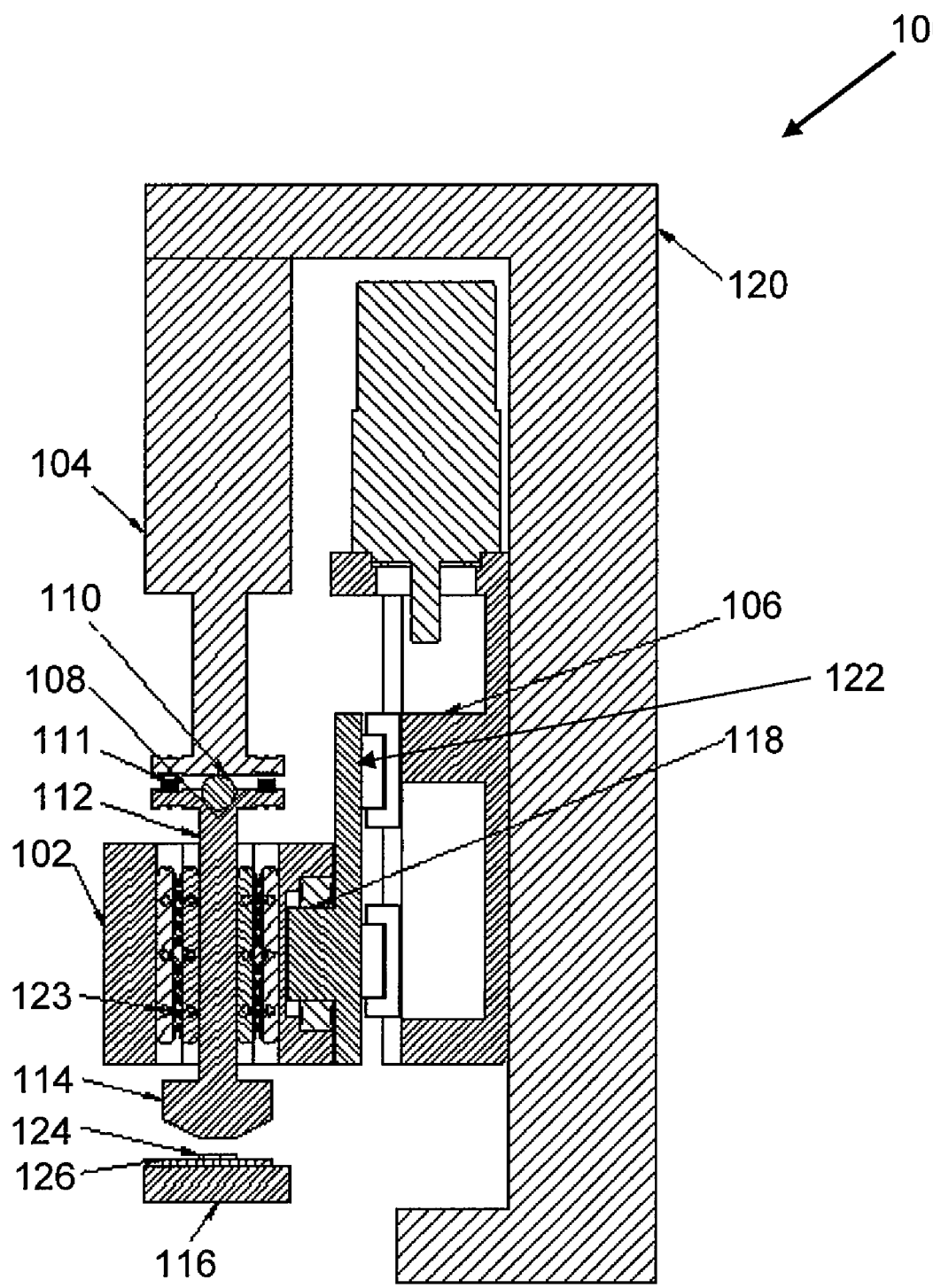
FIG. 1 is a side view of a conventional die bonder incorporating a pneumatic cylinder to provide a bonding force.
Figure 2:
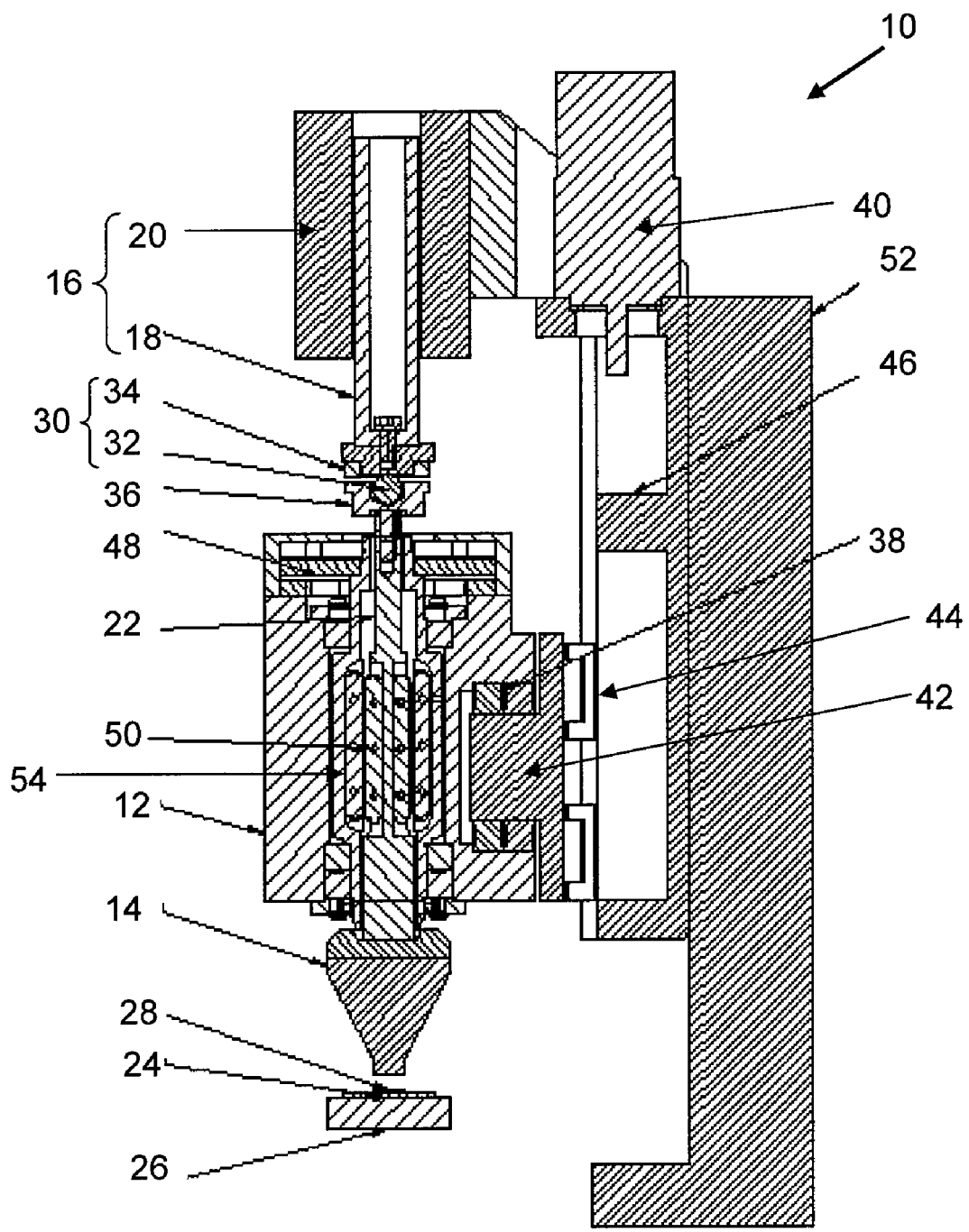
FIG. 2 is a side view of a die bonder incorporating a bond head that generates a large bonding force according to the preferred embodiment of the invention.

FIG. 2 is a side view of a die bonder 10 incorporating a bond head 12 that generates a large bonding force according to the preferred embodiment of the invention. The bond head 12 comprises a collet 14 and a first motor or a bond force motor 16, which is preferably a linear motor or a pneumatic cylinder. A linear motor is illustrated in FIG. 2, and it generally comprises a bond force motor forcer 18 and a bond force motor stator 20. The bond force motor 16 is operatively connected to the collet 14 via a load shaft 22 which passes through the bond head 12. The collet 14 is located at an end of the load shaft 22 which is remote from the bond force motor 16. The bond force motor 16 drives the load shaft 22 along a travel axis such as the z-axis in directions towards and away from a die bonding position on a substrate 24 which is located on a bond stage 26. The collet 14 picks up and holds a die 28 using vacuum suction or with a gripper and bonds the die 28 to the die bonding position on the substrate 24. The bond force motor 16 together with the bond head 12 enables the die bonder 10 to generate a large bonding force for bonding the die 28 to the substrate 24.

The load shaft 22 is coupled to the bond force motor 16 via a coupler, such as a magnetic coupler 30. The magnetic coupler 30 allows the bond force motor 16 to be decoupled from any rotary motion of the load shaft 22 although the bond force motor 16 is coupled with the z-axis motion of the load shaft 22. Therefore, the magnetic coupler 30 renders it feasible to apply a pneumatic cylinder as the bond force motor 16 since it will be decoupled from the rotary motion of the load shaft 22 when the collet 14 holding a die 28 is rotated.

The magnetic coupler 30 may comprise a bearing in the form of a ball 32 and a coupler magnet 34. The ball 32, which may be made of steel, is embedded in a ball seat mount in the form of a coupler ball holder 36 which is made of a magnetic material and is spaced from the coupler magnet 34. The coupler ball holder 36 may be secured to either the load shaft 22 or the bond force motor 16 and the coupler magnet 34 may be secured to the other of the bond force motor 16 or the load shaft 22. The coupler magnet 34 is operative to provide a magnetic traction force on the coupler ball holder 36 which attracts the load shaft 22 and the bond force motor 16 towards each other.

The bond force motor 16 together with the magnetic traction force may provide an upward force to counterbalance the weight of the collet 14 and the load shaft 22 for the application of a low bonding force. The ball 32 located between the coupler magnet 34 and the coupler ball holder 36 is able to rotatably contact the coupler magnet 34 at a spherical point of contact. Hence, the load shaft 22 may rotate about a rotational axis relative to the bond force motor 16 so that the bond force motor 16 is decoupled from the rotary motion of the load shaft 22. At the same time, the magnetic coupler 30 provides some degree of freedom in the XY direction when adjusting the co-planarity of the collet 14 to the bond stage 26 with the aid of a tilting alignment mechanism 38. The tilting alignment mechanism 38 is coupled to the bond head 12 for changing a tilting angle of the load shaft 22 to the bond force motor 16 about the magnetic coupler 30.

A second or universal motor, such as a z-motor 40, is coupled to the bond head 12 and the bond force motor 16 via a bond head mount 42 and drives both the bond head 12 and the bond force motor 16 to move through larger distances along the z-axis. This driving motion is provided when the z-motor 40 drives a z-slider 44 which is coupled to the bond head mount 42 to move relative to a z-axis motion table 46. Both the bond force motor 16 and the z-motor 40 are also mounted to a support structure 52.

A rotary motor 48 may be mounted to the bond head 12 and is operatively connected to the load shaft 22 to rotate the load shaft 22 and the collet 14 about a rotational axis parallel to the z-axis via a motor rotor 54 of the rotary motor 48. This allows the angular orientation of the picked die 28 to be adjusted relative to the substrate 24 and compensated before the die 28 is bonded to the substrate 24. The rotary motor 48 is decoupled from the bond force motor 16 by the magnetic coupler 30 located in a force application path of the bond force motor 16. The rotary motor 48 is also decoupled from the z-motor 40 so that the rotary motor 48 is operative to rotate the load shaft 22 relative to the z-motor 40.

The die bonder 10 further incorporates a downward-looking optical device (not shown) and an upward-looking optical device (not shown) for the purpose of aligning the die 28 with the substrate 24. In operation, an image of the die 28 taken from the downward-looking optical device is captured so that the relative position of the die 28 with respect to the substrate 24 can be determined. The die 28 is transported by a shuttle conveyor (not shown) to and underneath the bond head 12 for picking up the die 28. X-Y compensation on a horizontal plane can be carried out by another shuttle conveyor (not shown) which is driven by an X-Y table.

Theta compensation may also be performed before the bond head 12 picks up the die 28 and aligns the collet 14 to the die 28 with the aid of the downward-looking optical device. The load shaft 22 is slidable relative to the rotary motor 48 and the bond head 12 by means of a slidable bearing 50 located between the load shaft 22 and the bond head 12 which is located on the motor rotor 54. The slidable bearing 50 enables the load shaft 22 to reposition itself in the z-axis relative to the bond head 12 when it is driven by the large bond force motor 16. The X-Y and theta compensations ensure that the die 28 is aligned accurately with the collet 14 when it is picked up by the collet 14.

The shuttle moves away and the image of the die 28 is then captured by the upward-looking optical device such that the position of the die 28 relative to the substrate 24 can be determined. Then, the bond head 12 rotates and aligns the die 28 according to the orientation of the substrate 24 using a vision alignment system (not shown) which views the substrate 24 before bonding is carried out.

The z-motor 40 drives the bond head 12 downwards via the z-slider 44 and stops once the die 28 contacts the substrate 24 and a feedback signal from a touch-down sensor is received. The bond force motor 16 which is located axially with the rotary centre of the bond head 12, applies a large compressive force to the die 28 directly through the load shaft 22 and the collet 14. Preferably, only the bond force motor 16 but not the z-motor 40 generates a z-axis drive-in motion on the die 28 to apply a downward bonding force to bond the die 28 at the bonding site of the substrate 24. The bond head 12 which is mounted on the bond head mount 42 is decoupled from this z-axis driving motion by the load shaft 22, which is slidably movable relative to the bond head 12. In this way, a bonding load resulting from a large drive-in motion of the die 28 to the substrate 24 after the die 28 contacts the substrate 24 is not transmitted to the bond head mount 42.

Therefore, no load is passed directly from the bond head 12 to the bond head mount 42 and the z-axis motion table 46, which are thus decoupled from the z-axis driving motion. This avoids deforming the bond head mount 42 and the z-axis motion table 46 so that placement error due to structural deformation can be avoided. Placement error due to roll, pitch and yaw of the z-axis motion table 46 can also be avoided as there is no drive-in motion by the z-motor 40 after the die 28 contacts the substrate 24.

It should be appreciated that the die bonder 10 according to the preferred embodiment of the invention achieves die bonding with a large bonding force with precision while meeting the requirement for non-tilting of the die 28 and for rotary offset compensation. The magnetic coupler 30 allows the bond force motor 16 to be decoupled from the rotary motion of the load shaft 22 while it remains coupled to the movement of the bond head 12 in the z-axis. As the magnetic coupler 30 couples axial motion and decouples rotary motion between the bond head 12 and the bond force motor 16, a non-rotary bond force actuator such as a pneumatic cylinder can be applied as a bond force motor 16 for rotary bond head application. The spherical point of contact provided by the magnetic coupler 30 also provides a degree of freedom in the XY direction when adjusting co-planarity of the collet 14 to the bond stage 26 using the tilting alignment mechanism 38.

Further, a compression load acts on the die 28 directly by a force from the bond force motor 16 passing through the load shaft 22 and the collet 14. The magnetic traction force is also designed to be sufficiently large to counter balance the weight of the collet 14 and the load shaft 22 so that a low bonding force may be applied by an upwards pulling force from the bond force motor 16.

Additionally, by decoupling the bond force motor 16 from the z-motor 40 and the rotary motor 48 using the load shaft 22, a placement error of the bond head 12 due to the structural deformation of the bond head mount 42 and the z-axis motion table 46 can be reduced when a large bonding force is used during die bonding. Placement shift due to the z-axis drive-in motion, as well as die tilting, can also be avoided as no load passes through the bond head mount 42 and the z-axis motion table 46, which have been decoupled from the bond force motor 16.

The invention described herein is susceptible to variations, modifications and/or addition other than those specifically described and it is to be understood that the invention includes all such variations, modifications and/or additions which fall within the spirit and scope of the above description.

The invention claimed is:

1. Die bonder comprising:
   a bond head having a load shaft passing through the bond head and a collet located at one end of the load shaft for holding a die to be bonded;
   a bond force motor operative to drive the load shaft along a travel axis in directions towards and away from a die bonding position;
   a rotary motor operative to rotate the load shaft about a rotational axis parallel to the travel axis; and
   a coupler for coupling the load shaft to the bond force motor;
   wherein the coupler further comprises a bearing which is configured to allow the load shaft to rotate about the rotational axis relative to the bond force motor.

2. Die bonder as claimed in claim 1, wherein the bond force motor is a linear motor comprising a motor forcer and a motor stator.

3. Die bonder as claimed in claim 1, wherein the rotary motor is mounted on the bond head.

4. Die bonder as claimed in claim 1, further comprising a slidable bearing between the load shaft and the bond head which is configured to allow the load shaft to move relative to the bond head along the travel axis.

5. Die bonder as claimed in claim 1, wherein the bearing comprises a ball embedded in a ball seat mount.

6. Die bonder as claimed in claim 5, wherein the ball is made of steel.

7. Die bonder as claimed in claim 5, wherein the ball seat mount is secured to either the load shaft or the bond force motor.

8. Die bonder as claimed in claim 7, further comprising a coupler magnet spaced from the ball seat mount and secured to the other of the bond force motor or the load shaft, and which is operative to provide a magnetic force attracting the load shaft and the bond force motor towards each other.

9. Die bonder as claimed in claim 8, wherein the ball seat mount is made of a magnetic material and the coupler magnet generates a magnetic traction force on the ball seat mount.

10. Die bonder as claimed in claim 8, wherein the ball is located between the coupler magnet and ball seat mount and rotatably contacts the coupler magnet at a spherical point of contact.

11. Die bonder as claimed in claim 1, further comprising a universal motor operatively coupled to the bond head and bond force motor to move both the bond head and bond force motor along the travel axis.

12. Die bonder as claimed in claim 11, wherein the rotary motor is operative to rotate the load shaft relative to the universal motor.

13. Die bonder as claimed in claim 11, wherein only the bond force motor but not the universal motor is configured to apply a die bonding force during bonding of the die.

14. Die bonder as claimed in claim 1, further comprising a tilting alignment mechanism coupled to the bond head for changing a tilting angle of the load shaft relative to the bond force motor about the bearing.

* * * * *